United States Patent [19]
Takahashi et al.

[11] Patent Number: 5,535,789
[45] Date of Patent: Jul. 16, 1996

[54] LEAD WIRE FORMING APPARATUS CAPABLE OF PREVENTING THE PEELING OF THE SOLDER FROM THE LEAD WIRE

[75] Inventors: Yutaka Takahashi; Junichi Uehara, both of Tokyo; Hidemi Matsukuma, Kumamoto, all of Japan

[73] Assignee: NEC Corporation, Tokyo, Japan

[21] Appl. No.: 300,522

[22] Filed: Sep. 2, 1994

[30] Foreign Application Priority Data

Sep. 7, 1993 [JP] Japan .................................. 5-221574

[51] Int. Cl.[6] ............................................. B21F 1/00
[52] U.S. Cl. ....................................... 140/105; 72/315
[58] Field of Search ................................. 140/105, 147; 72/315

[56] References Cited

FOREIGN PATENT DOCUMENTS

| 0162521 | 6/1989 | Japan | 140/105 |
|---|---|---|---|
| 0157717 | 6/1989 | Japan | 140/105 |
| 2284454 | 11/1990 | Japan . | |
| 5237580 | 9/1993 | Japan | 140/105 |
| 2277702 | 11/1994 | United Kingdom | 140/105 |

*Primary Examiner*—Daniel C. Crane
*Assistant Examiner*—Ed Tolan
*Attorney, Agent, or Firm*—Sughrue, Mion, Zinn, Macpeak & Seas

[57] ABSTRACT

First and second dies are movably opposed to each other. The second die is for pinching a package and a lead wire of the package in cooperation with the first die with a portion of the lead wire that protrudes from the first and the second dies. A slidable base is slidably supported on a die surface of the first die and has an inclined surface. A base pushing rod is movable in a direction which is substantially perpendicular to a base surface of the slidable base. The base pushing rod has an inclined rod surface which is opposed to the inclined surface. A spring urges the slidable base to make the inclined base surface be brought into contact with the inclined rod surface. The base pushing rod moves the slidable base towards the package together with one end portion of the lead wire that is supported on the slidable base when the protruded portion of the lead wire is pushed by the wire pushing member. The slidable base may have a cam follower internal surface which defines a cam hole. In this case, a cam roller is inserted in the cam hole. The slidable base may be moved by the cam roller.

5 Claims, 2 Drawing Sheets

LEAD WIRE FORMING APPARATUS CAPABLE OF PREVENTING THE PEELING OF THE SOLDER FROM THE LEAD WIRE

BACKGROUND OF THE INVENTION

This invention relates to an apparatus for forming a lead wire of a package which receives semiconductor devices.

Lead wire forming apparatus of the type described is disclosed in Japanese Unexamined Patent Prepublication (Kôkai) No. 2.84454/1990. The conventional lead wire forming apparatus comprises a first die, a second die, a third die, a slidable board or base, and a wire pushing member.

The second die is opposed to the first die and is movable to the first die. The second die is for pinching a package and lead wires of the package in cooperation with the first die with protruded portions of the lead wires that are protruded from the first and the second dies.

The first die has a die surface under the protruded portions of the lead wires. The slidable base is slidably supported on the die surface through a ball bearing. The third die is movable to the first die. The wire pushing member is fixed to the third die and is moved together with the third die. The wire pushing member pushes the protruded portions of the lead wires to form predetermined forms with one end portion of the lead wires that are supported on the slidable base when the wire pushing member is moved downwardly.

The protruded portions of the lead wires are pushed by the wire pushing member and formed. The slidable base is moved together with the protruded portions of the lead wires by friction between the slidable base and the protruded portions of the lead wires when the protruded portions of the lead wires are displaced by the wire pushing member.

The first die has an internal die surface which defines an exhaust hole and an exhaust nozzle which is opposed to the slidable base. An air injector is associated with the exhaust hole. The air injector injects compressed air in the exhaust hole to exhaust the compressed air towards the slidable base through the exhaust nozzle. The slidable base is recovered to an initial position by the force of the compressed air which is injected from the exhaust nozzle.

However, inasmuch as the protruded portion of the lead wire has solder on its surface, the solder is easily peeled from the lead wire by the friction between the slidable base and the lead wire. Also, inasmuch as junks of the solder peeled from the lead wire easily enter between the slidable base and the die surface of the first die, the slidable base is hardly capable of moving smoothly. In addition, the lead wires are shorted when the junks of the solder readhere to the lead wires.

SUMMARY OF THE INVENTION

It is therefore an object of this invention to provide a lead wire forming apparatus which can prevent the peeling of the solder from the lead wire.

It is another object of this invention to provide lead wire forming apparatus which is capable of moving smoothly It is still another object of this invention to provide lead wire forming apparatus which can prevent readhering of the junks of the solder to the lead wires.

Other objects of this invention will become clear as the description proceeds.

According to this invention, a lead wire forming apparatus comprises (A) a first die having primary first, primary second, and primary third die surfaces; (B) a second die having secondary first and secondary second die surfaces which are opposed to the primary first and the primary second die surfaces, respectively, the second die movable to the first die, the secondary first die surface pinching a package in cooperation with the primary first die surface, the secondary second die surface pinching, in cooperation with the primary second die surface, a lead wire of the package with a portion of the lead wire that outwardly protrudes from the primary and the secondary second die surfaces; (C) a slidable base slidably supported on the primary third die surface, the slidable base having a base surface for receiving one end portion of the lead wire; (D) a wire pushing member movable in a direction which is substantially perpendicular to the base surface for pushing the protruded portion of the lead wire to form a predetermined form with the one end portion of the lead wire that is supported on the base surface; and (E) base moving means for moving the slidable base towards the package together with the one end portion of the lead wire.

DESCRIPTION OF THE PREFERRED EMBODIMENTS

Figure 1:
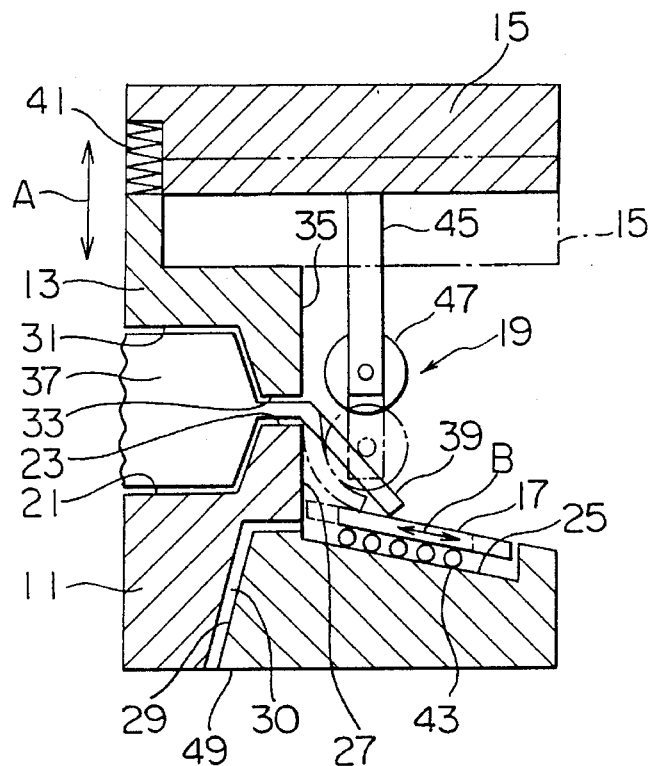
FIG. 1 is a schematic sectional view of conventional lead wire forming apparatus.

Referring to FIG. 1 a conventional lead wire forming apparatus will be described for a better understanding of this invention.

The conventional lead wire forming apparatus comprises a first die 11, a second die 13, a third die 15, a slidable board or base 17, and a wire pushing member 19.

The first die 11 has a primary first die surface 21, a primary second die surface 23, a primary third die surface 25, an intermediate vertical surface 27, and an internal die surface 29 which defines an exhaust hole 30 and an exhaust nozzle. The intermediate vertical surface 27 extends from the primary second die surface 23 to the primary third die surface 25. The primary third die surface 25 is an inclined surface.

The second die 13 is movable to the first die 11. The second die 13 is movably supported by a supporting member (not shown) and is moved by a driving device (not shown) in a driving direction (indicated by an arrow A) which is substantially perpendicular to the primary first die surface 21 of the first die 11.

The second die 13 has a secondary first die surface 31, a secondary second die surface 33, and a secondary vertical surface 35. The secondary vertical surface 35 is a prolongation surface of the intermediate vertical surface 27. The secondary first die surface 31 is for pinching a package 37, in cooperation with the primary first die surface 21. The package 37 receives semiconductor devices (not shown). The package 37 has a plurality of lead wires (collectively depicted at 39) which are connected to the semiconductor devices. The secondary second die surface 33 is for pinching, in cooperation with the primary second die surface 23, the lead wires 39 with portions of the lead wire 39 that outwardly protrude from the primary and the secondary second die surfaces 23 and 33, namely, the intermediate vertical surface 27 and the secondary vertical surface 35.

The third die 15 is movable to the first die 11. The third die 15 is movably supported by the supporting member and is moved by the driving device in the driving direction A which is substantially perpendicular to the primary first die surface 21 of the first die 11. A die compression spring 41 is interposed between the second and the third dies 13 and 15.

The slidable board 17 is slidably supported on the primary third die surface 25 of the first die 11 through a ball bearing 43. The slidable board 17 is slidable substantially along the primary third die surface 25 in a direction depicted by an arrow B. The wire pushing member 19 comprises a wire pushing rod 45 and a wire pushing roller 47. The wire pushing rod 45 is substantially parallel to the intermediate vertical surface 27 and the secondary vertical surface 35. An upper end portion of the wire pushing rod 45 is fixed to the third die 15. The wire pushing roller 47 is rotatably supported by a lower end portion of the wire pushing rod 45. The wire pushing roller 47 is moved together with the wire pushing rod 45 and the third die 15 in the driving direction A which is substantially perpendicular to the primary first die surface 21 of the first die 11. In other words, the wire pushing roller 47 is moved in a direction which is substantially parallel to the intermediate vertical surface 27 and the secondary vertical surface 35.

The wire pushing roller 47 pushes the protruded portions of the lead wires 39 to form predetermined forms with one end portion of the lead wires 39 that are supported on the slidable base 17 when the wire pushing roller 47 is moved downwardly. The protruded portions of the lead wires are pushed by the wire pushing roller 47 and formed. The slidable base 17 is moved together with the protruded portions of the lead wires 39 by friction between the slidable base 17 and the protruded portions of the lead wires 39 caused when the protruded portions of the lead wires 39 are displaced by the wire pushing roller 47.

The first die 11 further has a lower surface 49. The internal die surface 29 extends from the intermediate vertical surface 27 to the lower surface 49. An air injector (not shown) is associated with the exhaust hole 30 of the first die 11. The air injector injects compressed air in the exhaust hole 30 to exhaust the compressed air towards the slidable base 17 through the exhaust nozzle. The slidable base 17 is recovered to an initial position by the force of the compressed air which is injected from the exhaust nozzle of the exhaust hole 30.

However, inasmuch as the protruded portion of the lead wire 39 has solder on its surface, the solder is easily peeled from the lead wire 39 by the friction between the slidable base 17 and the lead wire 39. Also, inasmuch as junks of the solder peeled from the lead wire 39 easily enter between the primary third die surface 25 and the slidable base 17, the slidable base 17 is hardly capable of moving smoothly. In addition, the lead wires 39 are shorted when the junks of the solder readhere to the lead wires.

Figure 2:
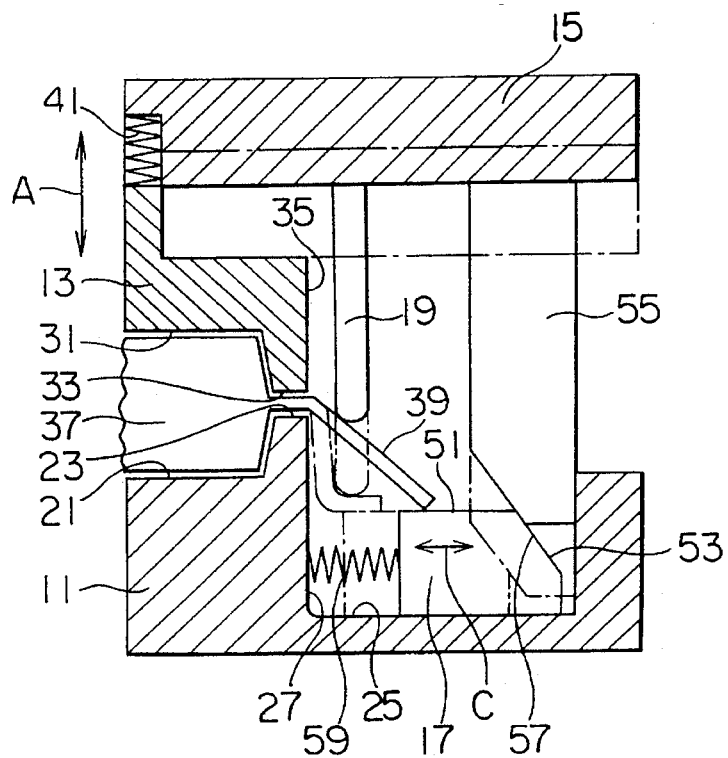
FIG. 2 is a schematic sectional view of lead wire forming apparatus according to a first embodiment of this invention.

Referring to FIG. 2, the description will proceed to lead wire forming apparatus according to a first embodiment of this invention. In FIG. 2, the lead wire forming apparatus comprises similar parts designated by like reference numerals.

The slidable base 17 is slidably supported on the primary third die surface 25 which is horizontal. The slidable base 17 is slidable in a slidable direction depicted by arrow C.

The slidable base 17 has a base surface 51 which receives one end portion of the lead wires 39. The slidable base 17 further has an inclined base surface 53 which is adjacent to the base surface 51 and is not opposed to the lead wires 39.

A base pushing rod 55 is fixed to the third die 15 and is placed between the third die 15 and the slidable base 17. The base pushing rod 55 is moved together with the third die 15 in the driving direction A. The base pushing rod 55 has an inclined rod surface 57 which is opposed to the inclined base surface 53 of the slidable base 17. A base compression spring 59 is interposed between the slidable base 17 and the intermediate vertical surface 27. The base compressing spring 59 urges the slidable base 17 to bring the individual base surface 53 into contact with the inclined rod surface 57. As a result, the slidable base 17 is moved in the slidable direction C by the base pushing rod 55 when the base pushing rod 55 is moved in the driving direction A.

The wire pushing member 19 comprises a rod. The wire pushing member 19 pushes the protruded portions of the lead wires 51 to form predetermined forms with one end portion of the lead wires 39 that are supported on the slidable base 17 when the wire pushing member 19 is moved downwardly. The protruded portions of the lead wires 39 are pushed by the wire pushing member 19 and formed. The slidable base 17 is moved together with the protruded portions of the lead wires 39 by the base pushing rod 55 when the protruded portions of the lead wires 39 are displaced by the wire pushing member 19.

On the other hand, the slidable base 17 is recovered to its initial position with a pushing force of the compression spring 59 when the wire pushing member 19 and the base pushing rod 55 are moved upwardly from stop positions depicted by chain lines.

Figure 3:
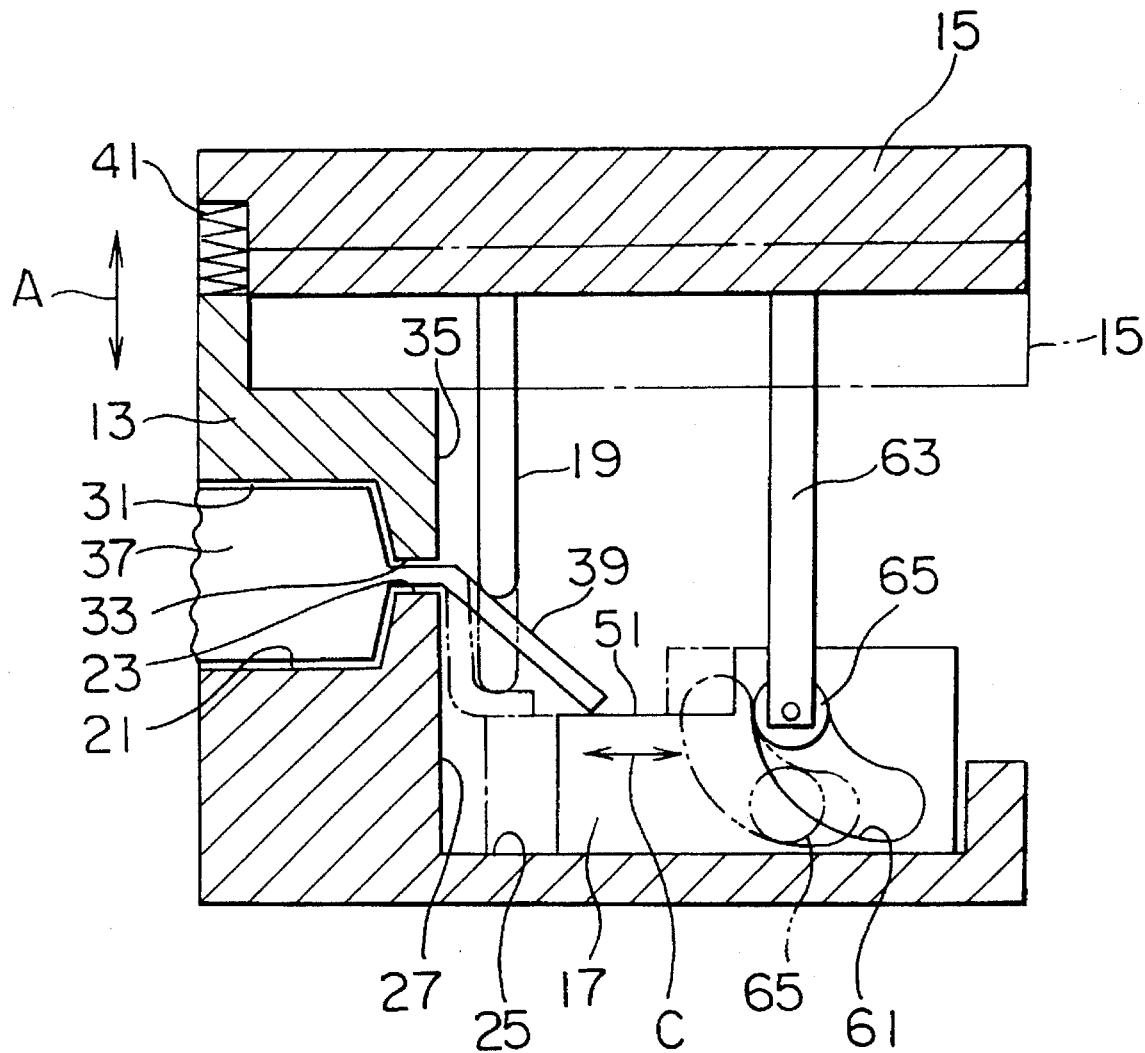
FIG. 3 is a schematic sectional view of lead wire forming apparatus according to a second embodiment of this invention.

Referring to FIG. 3, the description will proceed to lead wire forming apparatus according to a second embodiment of this invention. In FIG. 3, the lead wire forming apparatus comprises similar parts designated by like reference numerals.

The slidable base 17 has a cam follower internal surface 61 which defines a cam hole. A cam rod 63 is movable in a direction which is substantially perpendicular to the base surface 51. The cam rod 63 is fixed to the third die 15. A cam roller 65 is rotatably supported by an under portion of the cam rod 63. The cam roller 65 is rotatably inserted in the cam hole with the cam roller 65 brought into contact with the cam follower internal surface 61.

The cam roller 65 and the cam rod 63 are moved in the driving direction A together with the third die 15 by the driving device. The slidable base 17 is moved in the slidable direction C by the cam roller 65 and the cam rod 63 when the cam roller 65 and the cam rod 63 are moved in the driving direction A.

The wire pushing member 19 pushes the protruded portions of the lead wires 39 to form predetermined forms at one end portion of the lead wires 39 that are supported on the slidable base 17 when the wire pushing member 19 is moved downwardly. The protruded portions of the lead wires 39 are pushed by the wire pushing member 19 and formed. The slidable base 17 is moved together with the protruded portions of the lead wires 39 by the cam roller 65 and the cam rod 63 when the protruded portions of the lead wires 39 are displaced by the wire pushing member 19.

On the other hand, the slidable base 17 is recovered to its initial position with a pushing force of the cam roller 65 when the wire pushing member 19, the cam rod 63, and the cam roller 65 are moved upwardly from stop positions depicted by chain lines.

In FIGS. 2 and 3, the slidable base 17 is moved together with the protruded portion of the lead wire 39 by the base pushing rod 55 or the cam roller 65 when the protruded portion of the lead wire 39 is displaced by the wire pushing member 19. Consequently, friction between the lead wire 39 and the slidable base 17 is almost zero. As result, solder on a surface of the lead wire 39 is not peeled from the lead wire 39 when the lead wire 39 is pushed by the wire pushing member 19.

What is claimed is:

1. Lead wire forming apparatus comprising:

a first die having primary first, primary second, and primary third die surfaces;

a second die having secondary first and secondary second die surfaces which are opposed to said primary first and said primary second die surfaces, respectively, said second die movable to said first die, said secondary first die surface pinching a package in cooperation with said primary first die surface, said secondary second die surface pinching, in cooperation with said primary second die surface, a lead wire of said package with a protruded portion of said lead wire that is outwardly protruded from said primary and said secondary second die surfaces;

a slidable base slidably supported on said primary third die surface, said slidable base having a base surface for receiving one end portion of said lead wire;

a wire pushing member movable in a direction which is substantially perpendicular to said base surface for pushing said protruded portion of the lead wire to form a predetermined form with said one end portion of the lead wire that is supported on said base surface; and base moving means for moving said slidable base towards said package together with said one end portion of the lead wire.

2. Lead wire forming apparatus as claimed in claim 1, said slidable base having an inclined base surface, wherein said base moving means comprises:

a base pushing rod movable in a direction which is substantially perpendicular to said base surface, said base pushing rod having an inclined rod surface which is opposed to said inclined base surface; and a spring for urging said slidable base to make said inclined base surface be brought into contact with said inclined rod surface.

3. Lead wire forming apparatus as claimed in claim 2, said lead wire forming apparatus further comprising a third die movable to said first die, wherein said wire pushing member and said base pushing rod are fixed to said third die.

4. Lead wire forming apparatus as claimed in claim 1, said slidable base having a cam follower internal surface which defines a cam hole, wherein said base moving means comprises:

a cam rod movable in a direction which is substantially perpendicular to said base surface; and a cam roller rotatably supported by one end portion of said cam rod and inserted in said cam hole with said cam roller brought into contact with said cam follower internal surface.

5. Lead wire forming apparatus as claimed in claim 4, said lead wire forming apparatus further comprising a third die movable to said first die, wherein said wire pushing member and said cam rod are fixed to said third die.

* * * * *

UNITED STATES PATENT AND TRADEMARK OFFICE
CERTIFICATE OF CORRECTION

PATENT NO.    : 5,535,789
DATED         : July 16, 1996
INVENTOR(S)   : Takahashi et al.

It is certified that error(s) appears in the above-identified patent and that said Letters Patent is hereby corrected as shown below:

Column 4, line 18, delete "51" and insert --59--.

Signed and Sealed this

Seventeenth Day of December, 1996

Attest:

BRUCE LEHMAN

*Attesting Officer*              *Commissioner of Patents and Trademarks*